(12) United States Patent
Cheng

(10) Patent No.: US 7,852,630 B2
(45) Date of Patent: Dec. 14, 2010

(54) HEAT DISSIPATING DEVICE

(75) Inventor: Chia-Chun Cheng, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 230 days.

(21) Appl. No.: 12/191,532

(22) Filed: Aug. 14, 2008

(65) Prior Publication Data

US 2009/0109621 A1 Apr. 30, 2009

(30) Foreign Application Priority Data

Oct. 24, 2007 (TW) ............................... 96217785 U

(51) Int. Cl.
*H05K 7/20* (2006.01)
*H01L 23/34* (2006.01)
*F28F 7/00* (2006.01)
*F25B 21/02* (2006.01)

(52) U.S. Cl. .................... 361/700; 361/697; 174/15.2; 174/16.1; 174/16.3; 257/713; 257/715; 257/722; 165/80.4; 165/80.5; 165/104.33; 62/3.2

(58) Field of Classification Search .................. 361/697, 361/700; 174/15.2, 16.1, 16.3; 257/713, 257/715, 722; 165/80.4, 80.5, 104.33; 62/3.2
See application file for complete search history.

(56) References Cited

U.S. PATENT DOCUMENTS

| 6,181,556 | B1 * | 1/2001 | Allman ..................... 361/690 |
| 2005/0174737 | A1 * | 8/2005 | Meir ........................ 361/697 |
| 2006/0164808 | A1 * | 7/2006 | Stefanoski .................. 361/700 |
| 2009/0279251 | A1 * | 11/2009 | Liu et al. .................... 361/690 |

* cited by examiner

*Primary Examiner*—Zachary M Pape
(74) *Attorney, Agent, or Firm*—Chun-Ming Shih; HDLS IPR Services

(57) ABSTRACT

A heat dissipation device includes a base, a first heat pipe, a first heat sink, a second heat pipe, a thermoelectric cooler and a second heat sink. The first heat pipe includes a first end and a second end. The first end of the first heat pipe is connected to the base. The second end of the first heat pipe is connected to a bottom of the first heat sink. The second heat pipe includes a first end and a second end. The first end of the second heat pipe is connected to the base. The second end of the second heat pipe is connected to a top end of the thermoelectric cooler. The second heat sink is mounted on a bottom of the thermoelectric cooler and located at a side of the first heat sink. The thermoelectric cooler spaces apart from the heat generating member. As such, the water generated by the thermoelectric cooler during a cooling process won't spread to the heat generating member and a short circuit of the heat generating member can be avoided.

7 Claims, 5 Drawing Sheets

HEAT DISSIPATING DEVICE

BACKGROUND

The present invention relates a heat dissipating device, and particularly relates to a heat dissipating device for an interface card.

Nowadays, excessive heat generated in electronic devices has become a very difficult issue. Because of the heat accumulates in the electronic products, a temperature of electronic products increases gradually. It's known that performance of electronic products deteriorates as the temperature increases and a lifetime of electronic products is also reduced. Therefore, it is very important to maintain an inner temperature of electronic products at a low level.

Currently, air cooling devices, which employ fans to blow a cooling air flow for carrying heat off thereby cooling heat generating electronic components, are very popular in electronic products. However, electronic components are becoming smaller in size and more powerful in function. That is, more and more heat produces in a unit area. As a result, air cooling devices can't meet the increasingly requirement of heat dissipation. Especially in some electronic components such as interface cards, available mounting space for air cooling devices is limited. Therefore, air cooling devices can't be applied in these applications.

As shown in FIG. 1, a conventional heat dissipating device for an interface card is illustrated. The heat dissipating device includes a base 10 for adsorbing heat generated by a heat generating member (not shown). A number of heat pipes 20 are connected to the base 10, and one end of each heat pipe 20 is inserted into a first heat sink 30. The heat dissipating device further includes a thermoelectric cooling module 40 mounted on the base 10. A second heat sink 50 is mounted on the thermoelectric cooling module 40. A fan 60 is disposed on the second heat sink 50. The heat generated by the heat generating member firstly spreads to the base 10, and the heat pipe 20 conducts the heat to the thermoelectric cooling module 40. Finally, the heat reaches the first heat sink 30 and the second heat sink 50, and the fan 60 dissipates the heat to the ambient atmosphere.

The heat dissipating device can meet a general heat dissipating requirement of interface cards. However, the heat dissipating device also has some shortages. First of all, because of the thermoelectric cooling module 40 is in direct contact with the base 10, thus a temperature at a joint of the thermoelectric cooling module 40 and the base 10 is greatly less than a temperature of the heat pipe 20. As a result, most of the heat generated by the heat generating member is conducted to the thermoelectric cooling module 40. A heat dissipating ability of the heat pipe 20 is not fully used and a heat dissipating efficiency is very low. In addition, the thermoelectric cooling module 40 is in contact with the heat generating member, therefore water generated by the thermoelectric cooling module 40 during a heat dissipating process may reaches to the heat generating member and finally cause a short circuit of the heat generating member.

BRIEF SUMMARY

To overcome aforementioned problems, an objection of the present invention is to provide a heat dissipating device that is capable of meeting different heat dissipating requirements in different conditions and has a high efficiency.

In one embodiment, a heat dissipation device includes a base, a first heat pipe, a first heat sink, a second heat pipe, a thermoelectric cooler and a second heat sink. The first heat pipe includes a first end and a second end. The first end of the first heat pipe is connected to the base. The second end of the first heat pipe is connected to a bottom of the first heat sink. The second heat pipe includes a first end and a second end. The first end of the second heat pipe is connected to the base. The second end of the second heat pipe is connected to a top end of the thermoelectric cooler. The second heat sink is mounted on a bottom of the thermoelectric cooler and located at a side of the first heat sink.

In the present heat dissipating device, the thermoelectric cooler spaces apart from the heat generating member. As such, the water generated by the thermoelectric cooler during a cooling process won't spread to the heat generating member and a short circuit of the heat generating member can be avoided.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
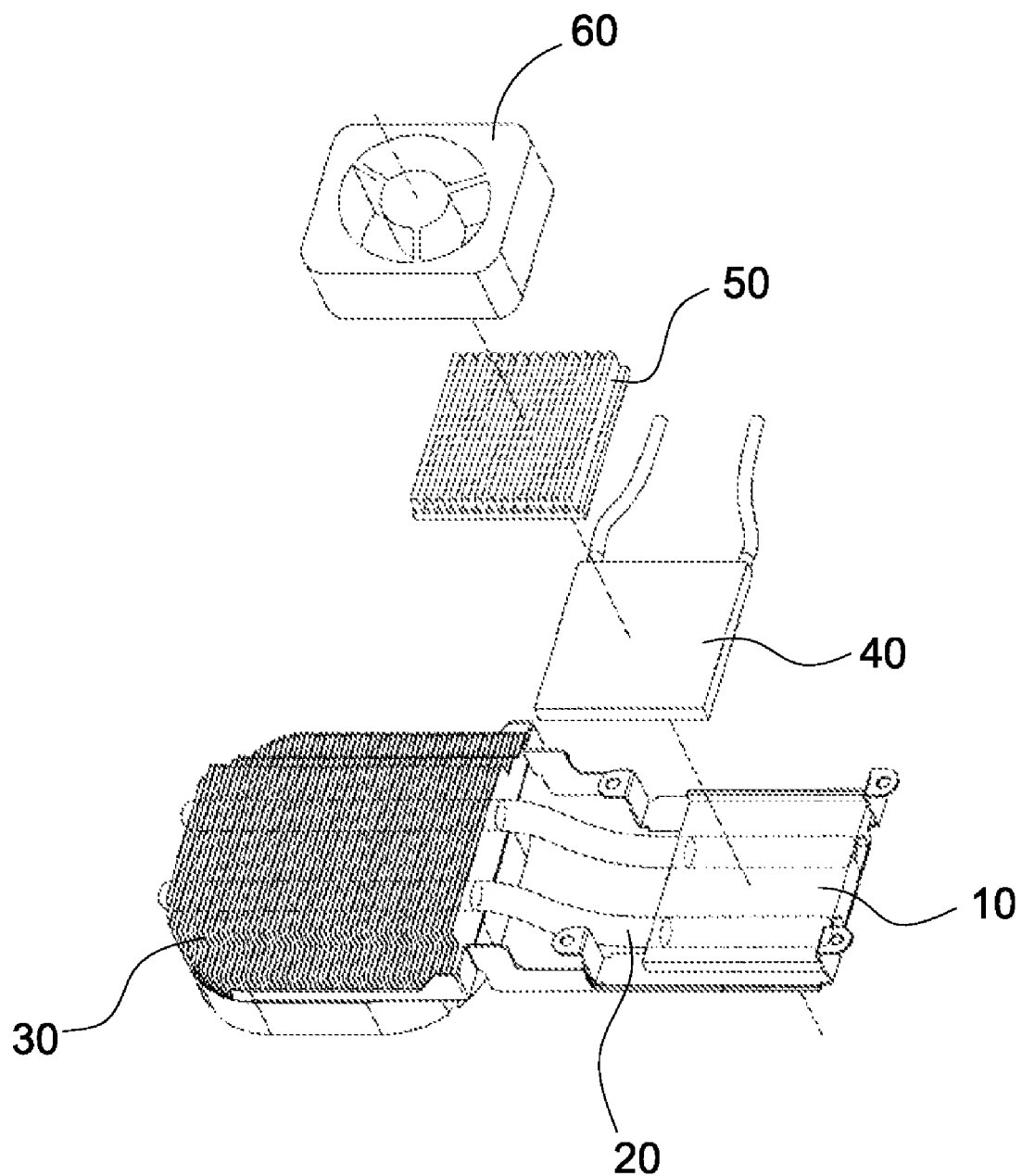
FIG. 1 is an exploded perspective view of a conventional heat dissipating device.
Figure 2:
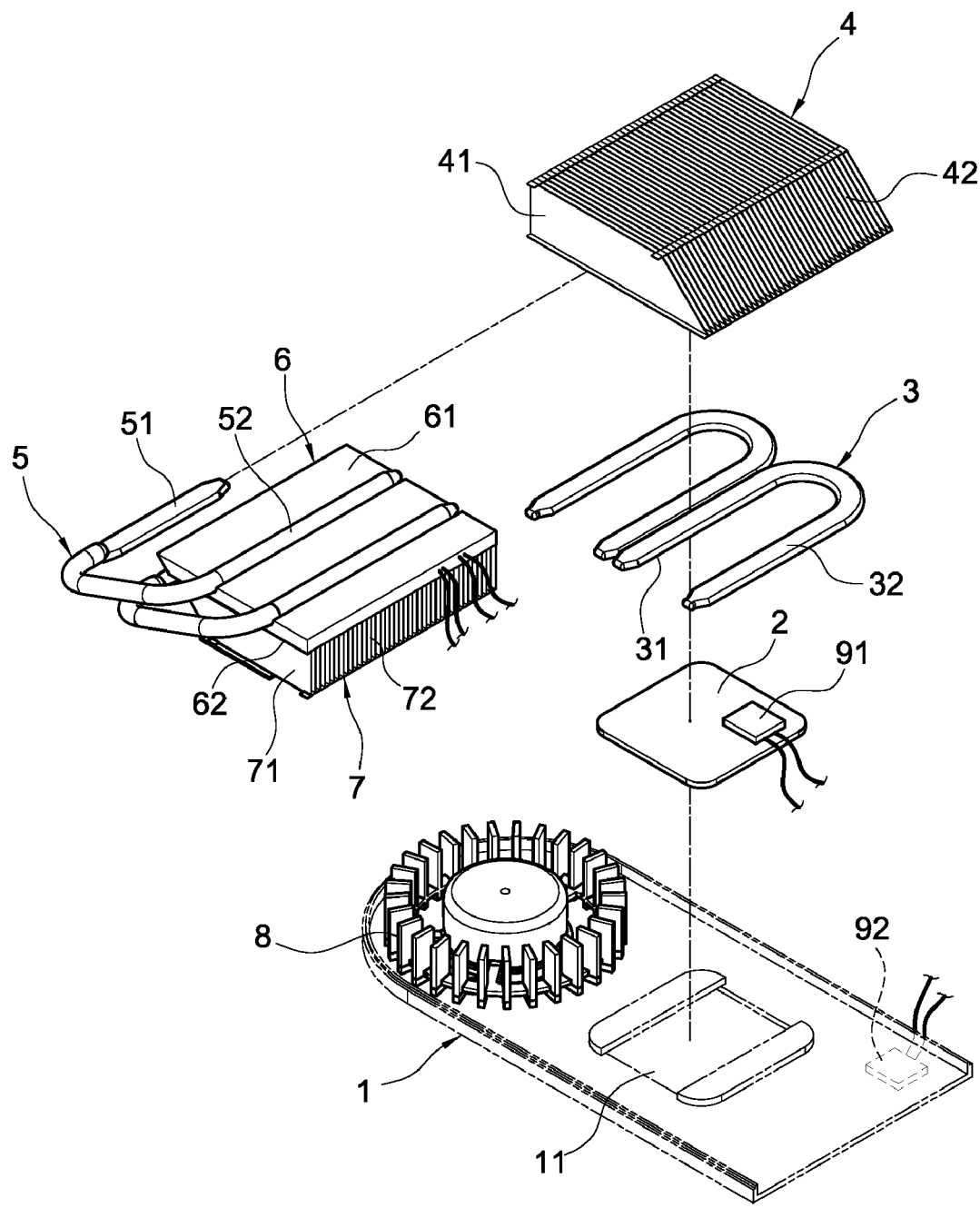
FIG. 2 is an exploded perspective view of a heat dissipating device in accordance an embodiment of the present invention.
Figure 3:
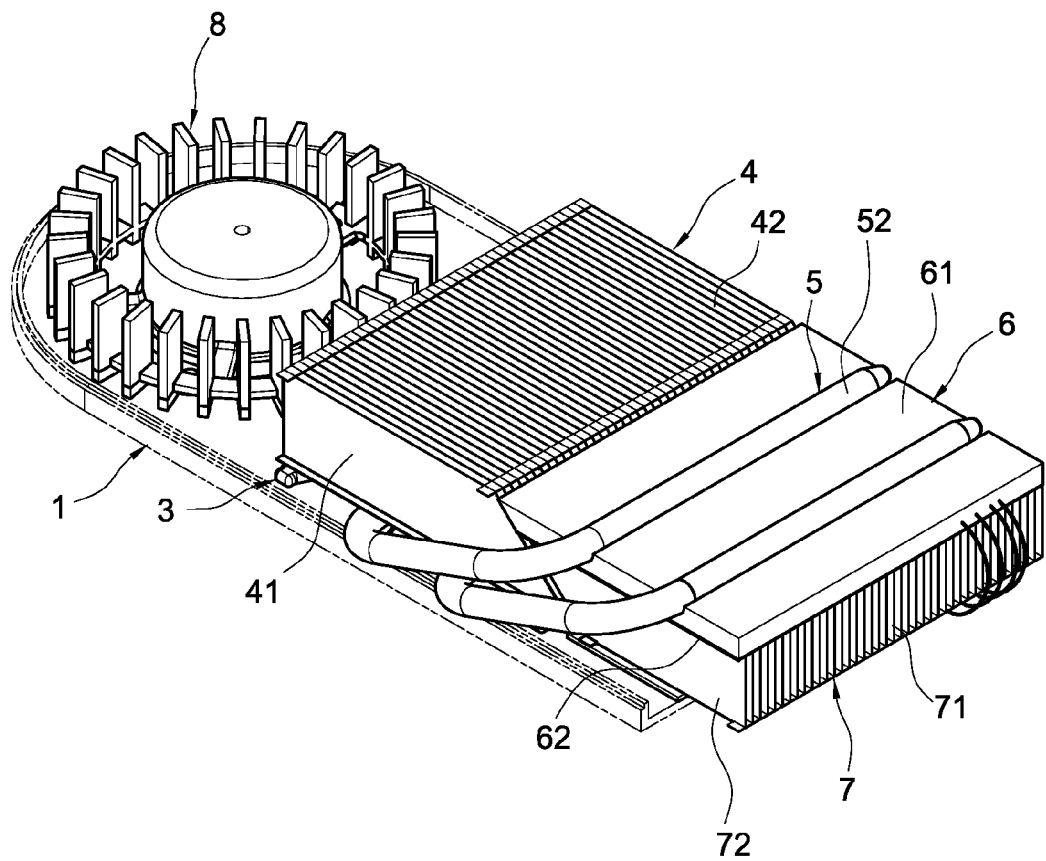
FIG. 3 is an assembled perspective view of the heat dissipating device of FIG. 2.

FIGS. 2 and 3 illustrate an exploded perspective view and an assembled perspective view of a heat dissipating device for mounting on a plate 1 in accordance with a first embodiment. The heat dissipating device includes a base 2. In the present embodiment, the base 2 is a flat plate, and the base 2 is placed on a through groove 11 formed in the plate 1. A surface of the base 2 is in direct contact with a heat generating member (not shown) and another surface of the base 2 is attached to at least one first heat pipe 3.

In the present embodiment, the heat dissipating device includes two first heat pipes 3. The first heat pipe 3 is flat and in "U" shape. A flat end surface of the first heat sink 3 that adjoins the base 2 forms a substantial first end 31, and another opposite flat end surface of the first heat sink 3 forms a second end 32.

The second end 32 of the first heat pipe is mounted on a first heat sink 4, which includes a number of heat dissipating fins 41. Each of the heat dissipating fins 41 is spaced apart from adjacent heat dissipating fins 41. Each two adjacent heat dissipating fins 41 define an air flow passage 42 between thereof. In addition, a second heat pipe 5 is also mounted on the base 2. In the present embodiment, the heat dissipating device includes two second heat pipes 5. The second heat pipe 5 includes a first end 51 and an opposite second end 52. The first end 51 is flat and is placed on the base 2 for adsorbing heat from the base 2.

The second end 52 of the second heat pipe 5 is connected to a thermoelectric cooler 6. A side of the thermoelectric cooler 6 is connected to a first temperature sensor 91 and a second temperature sensor 92 using electrical wires. The first temperature sensor 91 is mounted on the base 2 and the second temperature sensor 92 is mounted on a back side of the plate 1. The first temperature sensor 91 is configured for measuring a temperature of the base 2, and the second temperature sensor 92 is configured for measuring a temperature of the working environment of the heat dissipating device. The thermoelectric cooler 6 includes a first surface 61 and an opposite second surface 62. The first surface 61 is configured for absorbing heat from the second heat pipe 5. The second surface 62 is in contact with a second heat sink 7. The second heat sink 7 is disposed on the plate 1 and is adjacent to the first heat sink 4. The second heat sink 7 also includes a number of heat dissipating fins 71. Each of the heat dissipating fins 71 is spaced apart from adjacent heat dissipating fins 41. Each two adjacent heat dissipating fins 41 define an air flow passage 72 between thereof. In addition, the air flow passage 72 is parallel to a respective air flow passage 42.

Referring to FIG. 3, the heat dissipating device further includes a fan 8 mounted on a side of the plate 1. The fan 8 blows an air flow along a direction that is parallel to the air flow passage 42 of the first heat sink 4 and the air flow passage 72 of the second heat sink 7. The air flow generated by the fan 8 can easily passes through the first heat sink 4 and the second heat sink 7.

Figure 4:
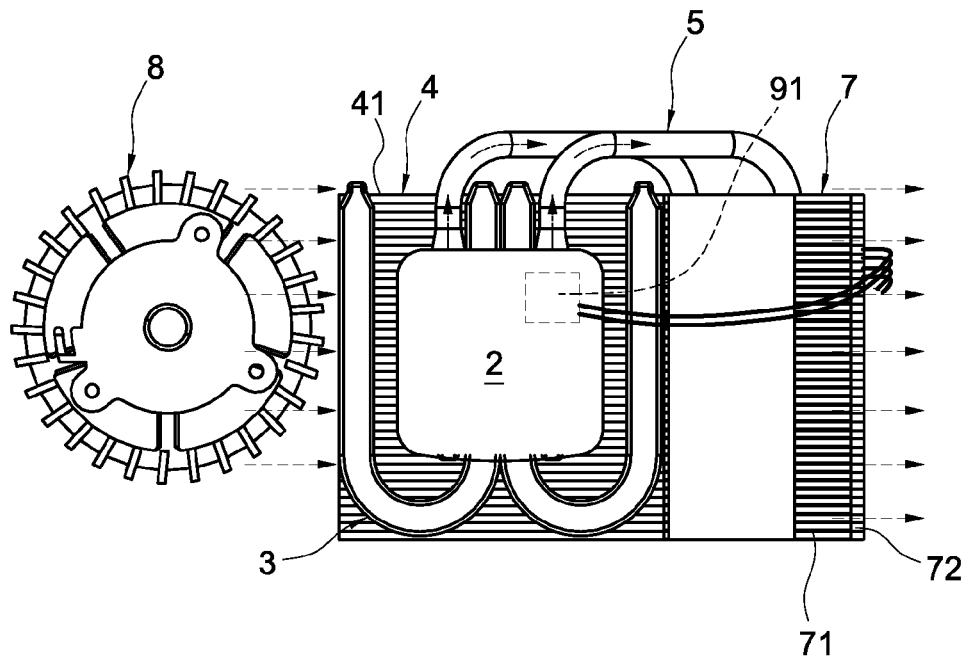
FIG. 4 is a top view showing an operation state of the heat dissipating device of FIG. 2.
Figure 5:
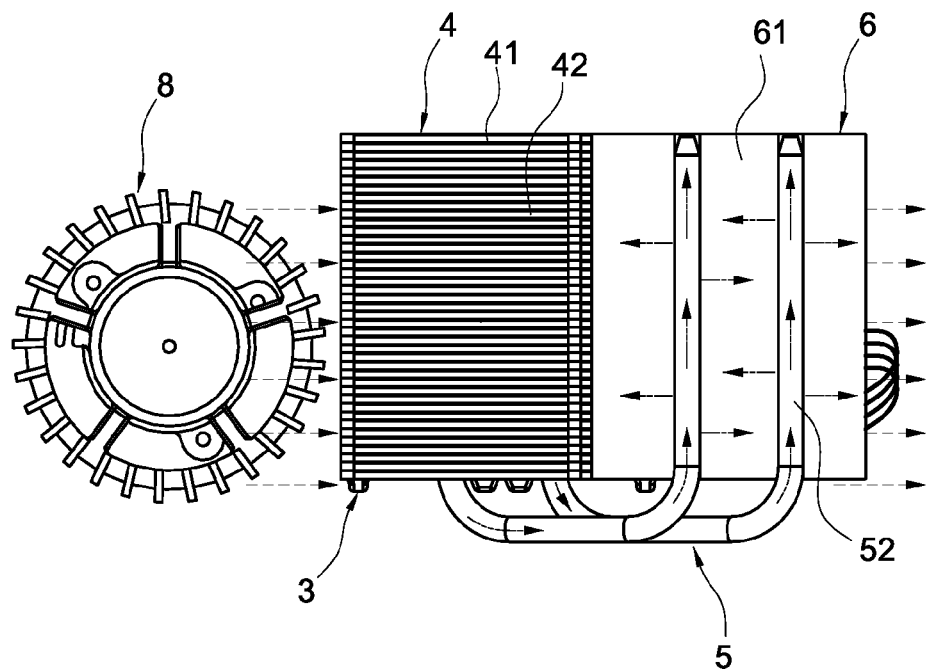
FIG. 5 is a bottom view showing an operation state of the heat dissipating device of FIG. 2.

FIGS. 4 and 5 illustrate a top view and a bottom view of an operation procedure of the heat dissipating device respectively. The base 2 adsorbs heat and transfers the heat to the first heat pipe 3. The first heat pipe 3 conducts the heat to the first heat sink 4, and finally, the air flow generated by the fan 8 flows through the air flow passage 42 of the first heat sink 4, carries the heat on surfaces of the heat dissipating fins 41 and spread it into outer atmosphere. Thus, the temperature of the heat generating member (not shown) is maintained at a low level. Simultaneously, the second heat pipe 5 efficiently adsorbs heat from the base 2 and transfers the heat from the first end 51 to the thermoelectric cooler 6 that is connected to the second 52 of the second heat pipe 5. As shown by the arrow in FIG. 5, the first surface 61 of the thermoelectric cooler 6 adsorbs heat from the second end 52 of the second heat pipe 5 and the thermoelectric cooler 6 efficiently transfers the heat to the second surface 62. The heat at the second surface 62 of the thermoelectric cooler 6 spreads to the second heat sink 7 and finally dissipates into ambient atmosphere by the heat dissipating fins 71 of the second heat sink 7. In addition, the fan 8 produces an air flow that flows through the air flow passage 72 of the second heat sink 7, and carries heat off the heat dissipating fins 71. In the present embodiment, a high heat dissipating efficiency can be achieved by combining the first heat pipe 3 and the second heat pipe 7.

Figure 6:
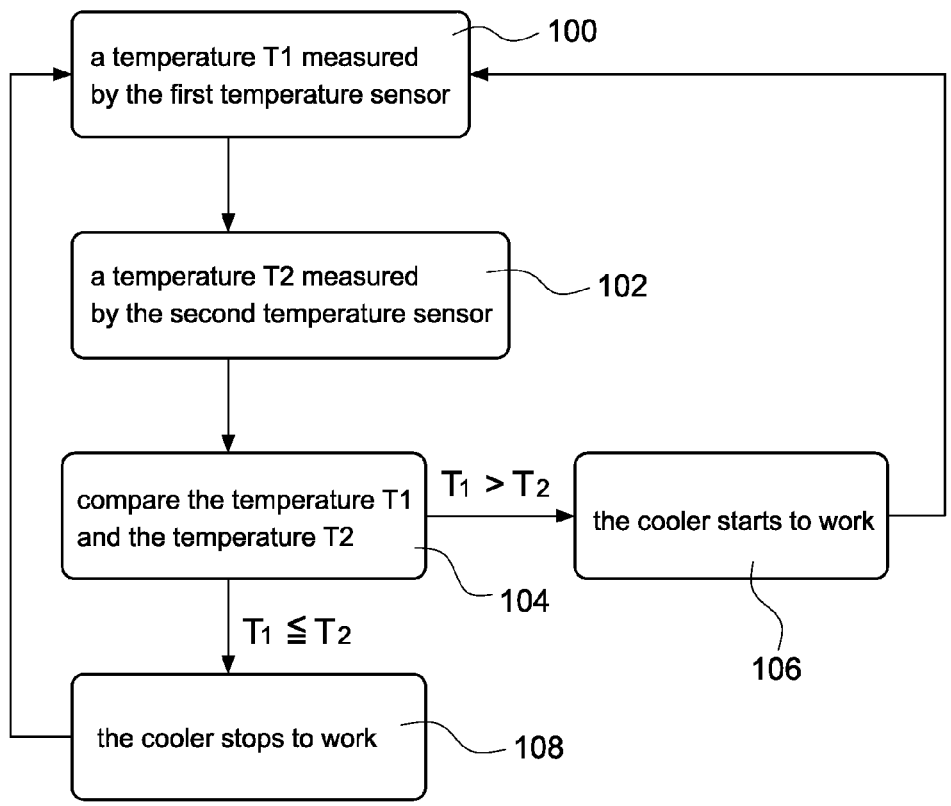
FIG. 6 is a flow chart of an operation procedure of a thermoelectric cooler in the heat dissipating device of FIG. 2.

Referring to FIG. 6, a controlling flow of the heat dissipating device is illustrated.

In step 100, a temperature T1 of the heat generating member is measured using the first temperature sensor.

In step 102, a working temperature T2 of the heat generating member is measured using the second temperature sensor.

In step 104, an inner system of the thermoelectric cooler compares T1 and T2.

In step 106, the thermoelectric cooler starts to work when T1 is greater than T2, and then steps 100 to 104 are repeated.

In step 108, the thermoelectric cooler stops when T1 is less or equal to T2, and then the steps 100 to 104 are repeated.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A heat dissipation device, comprising;
   a base;
   a first heat pipe, comprising a first end and a second end, the first end being connected to the base;
   a first heat sink, the second end of the first heat pipe is connected to a bottom of the first heat sink;
   a second heat pipe, comprising a first end and a second end, the first end of the second heat pipe being connected to the base;
   a thermoelectric cooler, the second end of the second heat pipe being connected to a top end of the thermoelectric cooler; and
   a second heat sink mounted on a bottom of the thermoelectric cooler and located at a side of the first heat sink,
   wherein the first heat sink comprising a plurality of heat dissipating fins, each two adjacent heat dissipating fins of the first heat sink defining an air flow passage therebetween, the second heat sink comprising a plurality of heat dissipating fins, and each two adjacent heat dissipating fins of the second heat sink defining an air flow passage therebetween,
   wherein the air flow passage of the first heat sink and the air flow passage of the second heat sink are parallel and aligned with each other, and
   wherein the heat dissipating device is mounted on a plate, and the heat dissipating device further comprises a first temperature sensor mounted on the base and a second temperature sensor mounted on a back side of the plate, the first and second temperature sensor being electrically connected to the thermoelectric cooler.

2. The heat dissipation device as claimed in claim 1, wherein the base is a flat plate.

3. The heat dissipation device as claimed in claim 1, wherein the first heat pipe is flat.

4. The heat dissipation device as claimed in claim 1, wherein the first end of the second heat pipe is flat.

5. The heat dissipation device as claimed in claim 1, wherein the thermoelectric cooler is a thermoelectric cooling module.

6. The heat dissipation device as claimed in claim 1, wherein the thermoelectric cooler comprising a first surface and a second surface, the first surface being in contact with the second end of the second heat pipe, the second surface is in contact with the second heat sink.

7. The heat dissipation device as claimed in claim 1, further comprising a centrifugal fan, the fan is configured for blowing an air flow along a direction that is parallel to the air flow passage of the first heat sink and the second heat sink.

* * * * *